United States Patent [19]
Caranhac et al.

[11] Patent Number: 5,986,296
[45] Date of Patent: Nov. 16, 1999

[54] CCD TYPE SEMICONDUCTOR DEVICE

[75] Inventors: Sophie Caranhac, Uriage; Pierre Blanchard, Echirolles, both of France

[73] Assignee: Thomson-CSF, Paris, France

[21] Appl. No.: 09/191,119

[22] Filed: Nov. 13, 1998

[30] Foreign Application Priority Data

Nov. 14, 1997 [FR] France ................... 97 14312

[51] Int. Cl.⁶ ............ H01L 27/148; H01L 29/768
[52] U.S. Cl. ............ 257/221; 257/218; 257/236; 257/246
[58] Field of Search ................ 257/218, 219, 257/221, 236, 246

[56] References Cited

U.S. PATENT DOCUMENTS

| | | | |
|---|---|---|---|
| 4,908,518 | 3/1990 | Losee et al. ................... | 348/322 |
| 5,055,931 | 10/1991 | Cazaux et al. . | |
| 5,286,987 | 2/1994 | Watanabe ..................... | 257/221 |
| 5,315,137 | 5/1994 | Asaumi et al. ................ | 257/221 |
| 5,331,165 | 7/1994 | Frame . | |
| 5,336,910 | 8/1994 | Murakami ..................... | 257/239 |
| 5,521,405 | 5/1996 | Nakashiba .................... | 257/248 |
| 5,578,511 | 11/1996 | Son ............................ | 438/144 |
| 5,861,642 | 1/1999 | Nakashiba .................... | 257/221 |

FOREIGN PATENT DOCUMENTS

WO 91/03840  3/1991  WIPO .

OTHER PUBLICATIONS

S. Strunk, et al., "A 4 Million Pixel CCD Array for Scientific Applications", SPIE, vol. 1900, 1993, pp. 157–168.

Primary Examiner—Ngân V. Ngô
Attorney, Agent, or Firm—Oblon, Spivak, McClelland, Maier & Neustadt, P.C.

[57] ABSTRACT

The disclosure relates to charge-coupled devices taking the form of shift registers and, more specifically, to those working in the MPP (Multi-Pinned Phase) mode, i.e. with high negative polarisation of the electrodes during the phases of waiting or of integration of integration of the photosensitive charges. These registers use a potential barrier created by a P type compensating implantation in a zone 16 located beneath a first electrode of each stage of the register. This barrier separates the stages from one another. To increase the charge storage capacity during the storage phase and the charge transfer capacity during the transfer, it is provided that the compensating implantation of the zone 16 will extend beneath only one part (and not the totality) of the first electrode of each stage of the register. Application to photosensitive image sensors, analog delay lines, charge-coupled analog memories, working in MPP mode during the waiting phases to limit losses of information due to the dark current. FIG. 4.

15 Claims, 2 Drawing Sheets

CCD TYPE SEMICONDUCTOR DEVICE

BACKGROUND OF THE INVENTION

1. Field of the Invention

The invention relates to CCD type devices and especially to those taking the form of shift registers and working in two modes, namely a waiting mode and a charge transfer mode.

Several examples may be given of such devices, especially image sensors, analog delay lines constituted as shift registers and charge-coupled analog memories.

Hereinafter, the invention will be explained above all with reference to image sensors whose operation takes place in two periods: a waiting period which is a period for the integration of charges generated by light in a charge-coupled register with several stages, and a period for the transfer of these charges from one stage to another along the register.

2. Description of the Prior Art

A CCD type photosensitive device of this kind conventionally has the following:

a P type semiconductor substrate on whose surface there is implanted an N type layer known as a "bulk transfer layer" or "volume transfer layer" in which the charges generated by light during the integration period are collected and into which these charges are then transferred during the transfer period; the bulk transfer layer or volume transfer layer is generally covered with a thin insulating layer;

and electrodes placed above the insulating layer, these electrodes enabling the creation of the potential wells in the N type layer, as a function of the potential that is applied to them; these electrodes are juxtaposed in such a way that the successive combinations of potential applied to the electrodes enable firstly the storage of electrical charges beneath certain electrodes and, secondly, the transfer of these charges from one electrode to the next one or from one group of electrodes to the next one.

In a particular mode of operation known as the multi-pinned phase or MPP mode, it is provided that all the electrodes will be taken to a highly negative potential during the charge integration phase. A layer of accumulation of positive mobile carriers is then set up on the surface of the bulk transfer layer. This accumulation layer is actually connected to the P substrate by various P type deep implanted zones present in the substrate. It is therefore taken to the potential of the substrate and it keeps the surface of the semiconductor at a reference potential which is the potential of the substrate. This has the effect of reducing the dark current of the device by neutralizing the charge carriers generated at the interface between the semiconductor and the insulating layer.

The surface potential of the semiconductor then tends to be the same beneath all the electrodes taken to this negative potential. There is a problem of the absence of confinement of the charges between the stages of the register during the integration period: the charges generated by light in one stage of the register are not naturally confined to the underside of this stage during the integration period. This is of course incompatible with the principle of the preparation of an image which, on the contrary, requires that the charges generated in a stage should remain well confined to this stage. This is why provision is made to prevent communication between two adjacent stages by setting up a potential barrier, formed by a P type implantation in the bulk transfer layer beneath one of the electrodes of a stage of the register.

This implantation locally raises the potential in the bulk transfer layer, thus forming a barrier against the passage of the charges from one stage of the register to another during the integration period.

FIG. 1 shows a schematic sectional view of a CCD type device of this kind. It has a P type semiconductor substrate 10, an N type bulk transfer layer 12 on the upper part of the substrate, a thin insulating layer 14 on the layer 12 and electrodes above the insulating layer.

The photosensitive register has several stages and each stage has several electrodes. The register shown is a three-phase register in which each stage has three electrodes: E1$a$, E1$b$, E1$c$ for one stage, E2$a$, E2$b$, E2$c$ for the next stage, etc.

Beneath the first electrode of each stage, namely beneath the electrodes E1$a$, E2$a$, etc., a P type compensation impurity (for example boron) is implanted. This impurity locally modifies the doping of the bulk transfer layer. The compensation in principle is not sufficient for the type of conductivity to be reversed. The zones 16 beneath the electrodes E1$a$, E2$a$ are therefore always zones with an N type conductivity but their equivalent N type doping is lower than that of the rest of the bulk transfer layer 12. The reference N$^-$ is used to symbolize this weaker N type conductivity in the zones 16.

The potentials applied to the three electrodes in MPP mode are identical during the integration period (about −8 volts conventionally). Owing to the reduced N conductivity in the zone 16, the depth of the potential wells created beneath the first electrode is smaller than the depth of the wells created beneath the second and third electrodes of each stage during the integration period. The result thereof is a potential barrier that prevents the passage of charges from one stage to the other of the register during this period. The charges generated by light remain confined beneath the second and third electrodes.

FIG. 2 shows the potentials in the bulk transfer layer during this period. The maximum charge that can be stored is limited, firstly, by the surface of the second and third electrodes and, secondly, by the height (which is relatively small since it comes only from the difference in doping between the zones 16 and the rest of the bulk transfer layer) of the potential barrier thus created.

During the period of the transfer of charges from one stage to another in the register, the electrodes are no longer taken to highly negative potentials. They are taken to positive or zero potentials in three successive phases so as to bring the charges together beneath only one electrode at a time and transfer them from one electrode to the next one and then from one stage to the next one.

During this phase, it is perceived that the shallowness of the potential well created in the implanted zone 16 limits the quantity of charges that can be transferred by the register. Indeed, during one of the transfer phases, all the charges are stored beneath the first electrode of each register. However, the greater the height of the potential barrier due to P type implantation, the shallower is the potential well created beneath this electrode (by a positive potential applied to this electrode).

FIG. 3 shows the configuration of the potential wells during a phase of this kind of the transfer operation.

If the register were to be a four-phase register (with four electrodes per stage), the charges would be assembled under two adjacent electrodes at a time during the transfer phases but the general principle of operation is the same.

For the three-phase registers, the most critical factor is the limitation of storage capacity during the transfer phase. For a four-phase register, the most critical factor is the limitation during the integration phase.

In general, we therefore come up against the need for a compromise between a compensating implantation that is high enough to increase the quantity of charges stored during the integration period or waiting period and small enough not to reduce the possibility of storage of charges beneath the first electrode during the transfer period.

The same problems arise for structures that are not photosensitive. This is the case for example for an analog delay line in which the information elements, prepared in the form of packets of charges, are kept in the line in MPP type waiting mode to reduce the dark current and are then transferred along the register. This is also the case for a linear or matrix-type analog memory in which the information is stored in the form of charge packets and kept waiting in MPP mode before use. For these devices, it is also necessary to find a compromise between the storage capacities of the compartments of the register in waiting mode and in transfer mode.

The present invention proposes an approach to improving the conditions of this compromise.

According to the invention, it is proposed that the P type compensating implantation should be made beneath only one part of the first electrode of each stage of the register, i.e. that this first electrode should cover both an N type non-compensated zone of the bulk transfer layer and a zone compensated by means of a P type impurity. Beneath the other electrodes, there is no such localized compensating implantation.

In the prior art, the P type compensating implantation was made throughout the uncovered zone between the last electrode of a stage and the second electrode of the next stage, by an implantation that is self-aligned with respect to these electrodes, before the deposition of the layer constituting the first electrode. Here, an additional implantation mask will be used, preserving the self-alignment of the zone compensated for on one side with the third electrode but masking a part of the N type layer on the second electrode side.

The invention can be applied to registers with three electrodes or more per stage, especially registers with three or four phases.

SUMMARY OF THE INVENTION

In other words, there is proposed a charge-coupled device comprising a shift register with several stages comprising M register electrodes per stage, a bulk transfer layer beneath the electrodes and a separation zone doped with a compensating impurity having a type of conductivity opposite that of the transfer layer, extending beneath a first electrode of each stage to ensure the separation of the charges detected in the different stages, this compensating implantation not extending beneath the other electrodes of the stage, wherein the separation zone extends beneath only one part of the first electrode of each stage, a non-compensated bulk transfer layer zone extending beneath another part of this first electrode.

The compensated zone is preferably as narrow as possible given the minimum widths laid down in the technology used.

For an application to a photosensitive sensor, the register itself may be photosensitive, the charges collected during the waiting period being possibly generated by light in the register itself. The register may also be not photosensitive and receive charges from an ancillary photosensitive device. The waiting period is then the period during which the register stores the charges in MPP mode without transferring them. For non-photosensitive applications (delay line, memory, etc.), the waiting period is also the one for which the register stores the charges in MPP mode before transferring them into non-MPP mode.

BRIEF DESCRIPTION OF THE DRAWINGS

Other features and advantages of the invention shall appear form the following detailed description made with reference to the appended drawings, of which.

MORE DETAILED DESCRIPTION

The invention shall be described in greater detail with reference to a photosensitive sensor.

Figure 1:
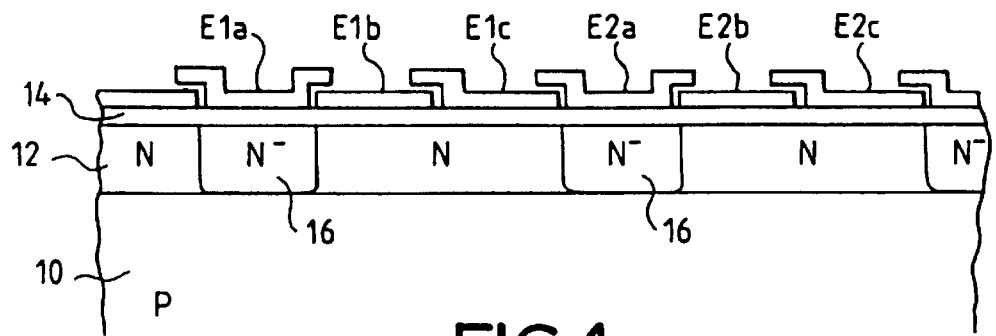
FIGS. 1 to 3, which have already been described, represent the constitution and operation of a prior art shift register.
Figure 4:
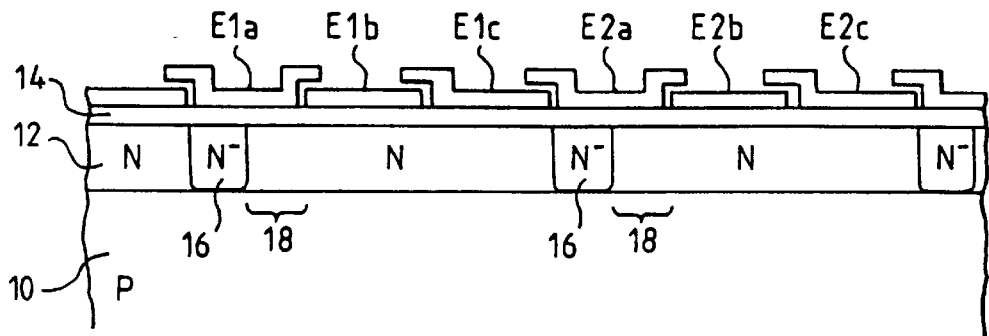
FIG. 4 gives a schematic view of a three-phase register according to the invention.

In FIG. 4, the same references as in FIG. 1 have been used for the same elements of the register, for the register of FIG. 4 is practically identical to the register of FIG. 1 except for the width of the compensated zone 16. This zone 16 now extends over only one part of the space between the two electrodes on either side of the first electrode, instead of extending throughout the width of this space.

Thus, the first electrode E2a of the second stage of the register is contained between the last electrode E1c of the previous stage and the second electrode E2b of the second stage. The zone of the bulk transfer layer located between these two electrodes E1c and E2b comprises, to the left, the zone 16 in which a P type compensating implantation has been made and, to the right, a zone 18 of non-compensated bulk transfer layer.

The compensated zone is preferably immediately adjacent to the zone covered by the last electrode (E1c) of the previous stage. If the compensated zone were to be on the other side (adjacent to the second electrode E2b), the charges would tend to be transferred towards the left in the figure during the charge transfer period. If the compensated zone were to be located in the middle of the space over which the first electrode hangs, then the charges would be poorly transferred.

To obtain the structure of FIG. 1, the second and third electrodes of the different stages were first of all formed by deposition and etching; then the compensating impurity was implanted in the zone reserved for the first electrode, without any implantation mask other than the second and third already deposited electrodes. The zone 16 was therefore self-aligned with respect to the electrodes. Finally, the first electrodes were deposited and etched. To obtain the structure of FIG. 4, the procedure follows the same order but the implanting operation is done through a mask that conceals the straight part of the space reserved for the first electrode (in other words, the zone 18 located on the second electrode side is masked). The mask is a mask of photosensitive resin.

The width of the compensated zone is preferably substantially equal to the minimum implantation width given the technology used. In other words, if the technology used has design rules with mask aperture widths and positioning tolerance values of the order of 1 micrometer, then a zone 16 with a width of about 1 micrometer is planned.

Figure 2:
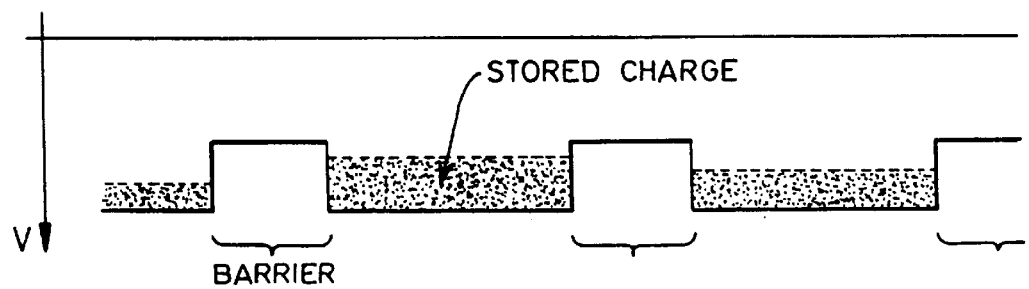
Figure 5:
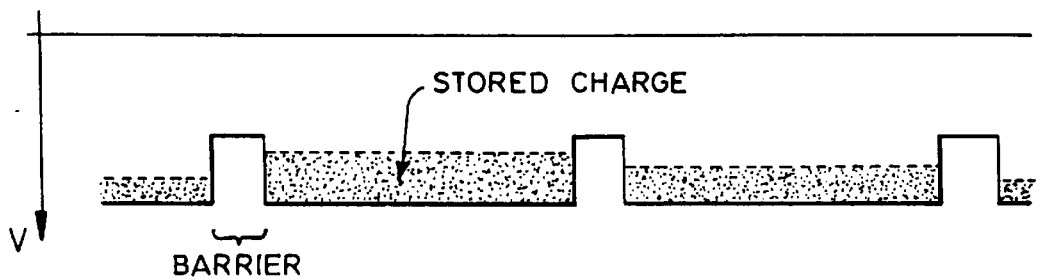
FIG. 5 shows the potential wells formed during the charge integration phase.

FIG. 5 shows the potential wells resulting therefrom during the integration of charges in MPP mode (with all the electrodes at one and same negative potential). For the same electrode surfaces E1a, E1b, E1c of a stage, the quantity of charges integrated for a given illumination is the same, but the quantity of charges that can be stored between two potential barriers is greater: the height of the potential barrier is the same (for one and the same compensating implantation) but the storage surface available is greater since it now comprises a part of the zone beneath the first electrode E1a or E2a. The potentials applied to the electrodes are assumed to be the same as in FIG. 2, for example −8 volts.

Figure 3:
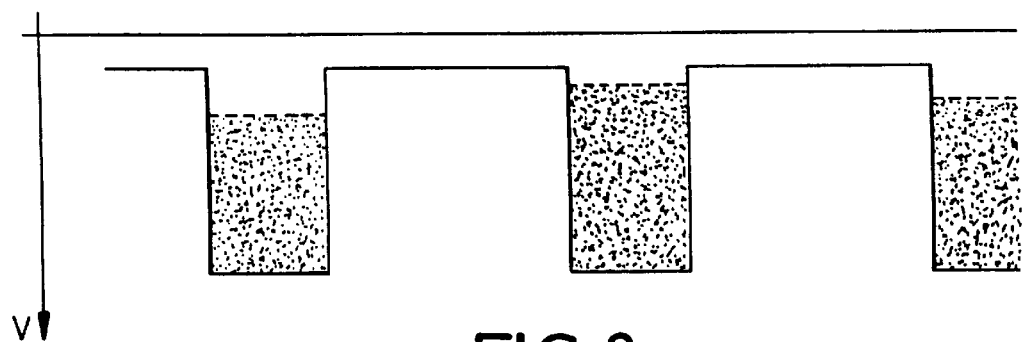
Figure 6:
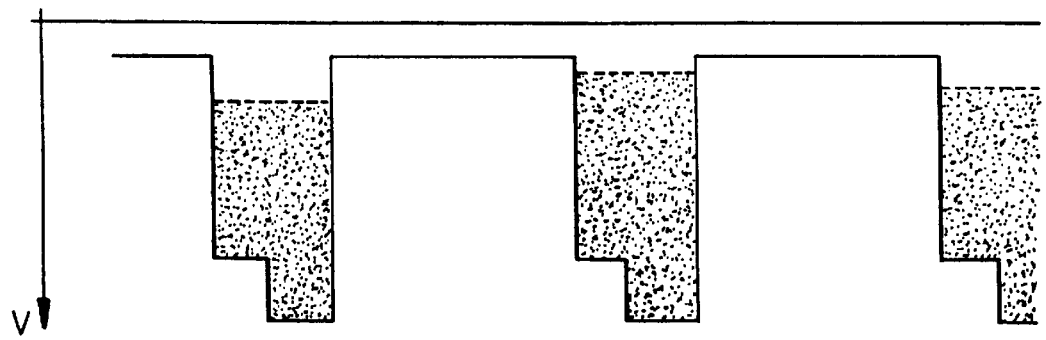
FIG. 6 shows the potential wells formed during one of the phases of the operation for transferring charges from one stage to the next.

FIG. 6 shows the potential wells during the charge transfer phase during which the charges are stored beneath the first electrode of each stage. For the same widths of the first electrode as in FIG. 1 and for the same potentials as in FIG. 3, the content of the potential well is greater in FIG. 6 than in FIG. 3 owing to the fact that it is only the left-hand part of the well that has a depth limited by the compensating implantation.

Thus, there is obtained both greater storage capacity during the integration period and greater transfer capacity during the transfer period. The risks of saturation is therefore smaller.

The structure of FIG. 4 is a register structure with three transfer phases hence three electrodes per stage. The invention can be applied to a four-phase register hence with four electrodes per stage or even more. In this case, it is still a part of the zone beneath the first electrode that receives compensation doping. The rest of this zone keeps the normal doping of the bulk transfer layer.

What is claimed is:

1. A charge-coupled device comprising:
    a shift register having a plurality of stages comprising,
        at least three register electrodes per each stage, and
        means for operating in a multi-pinned phase mode, wherein said register electrodes are set at a same potential;
    a bulk transfer layer beneath said register electrodes having a predetermined conductivity;
    a separation zone doped with a compensating impurity having a conductivity opposite said bulk transfer layer, said separation zone extending beneath a first part of a first electrode of said each stage and configured to prevent in multi-pinned phase mode charges stored under the other electrodes of said each stage from going under other electrodes of an adjacent stage; and,
    a non-compensated bulk transfer layer zone extending beneath a second part of said first electrode of said each stage and beneath said other electrodes.

2. A charge-coupled device according to claim 1, wherein the separation zone is adjacent to a zone covered by the last electrode of the previous stage.

3. A device according to claim 1, wherein the width of the separation zone is substantially equal to a minimum possible width of implantation given the technology used.

4. A device according to claim 1, wherein said device, is configured to be applied to a photosensitive sensor.

5. A device according to claim 4, wherein the shift register is photosensitive.

6. A device according to claim 1, wherein said device is configured to be applied to a delay line.

7. A device according to claim 1, wherein said device is configured to be applied to an analog memory.

8. A device according to claim 2 wherein said device is configured to be applied to a photosensitive sensor.

9. A device according to claim 1, wherein said device is configured to be applied to a delay line.

10. A device according to claim 2, wherein said device is configured to be applied to an analog memory.

11. A device according to claim 3, wherein said device is configured to be applied to a photosensitive sensor.

12. A device according to claim 3, wherein said device is configured to be applied to a delay line.

13. A device according to claim 3, wherein said device is configured to be applied to an analog memory.

14. A device according to claim 8, wherein the shift register is photosensitive.

15. A device according to claim 11, wherein the shift register is photosensitive.

* * * * *